(12) United States Patent
Tran et al.

(10) Patent No.: US 10,838,510 B2
(45) Date of Patent: Nov. 17, 2020

(54) GENERATING MODIFIED KEYBOARD DATA RECEIVED FROM A CLIENT DEVICE TO REDUCE UNINTENDED KEY REPETITION

(71) Applicant: HEWLETT PACKARD ENTERPRISE DEVELOPMENT LP, Houston, TX (US)

(72) Inventors: Minh Tran, Houston, TX (US); Tzong-Horng Sheen, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/767,882

(22) PCT Filed: Feb. 12, 2016

(86) PCT No.: PCT/US2016/017667
§ 371 (c)(1),
(2) Date: Apr. 12, 2018

(87) PCT Pub. No.: WO2017/138950
PCT Pub. Date: Aug. 17, 2017

(65) Prior Publication Data
US 2018/0307327 A1   Oct. 25, 2018

(51) Int. Cl.
*G06F 3/023* (2006.01)
*G06F 9/451* (2018.01)
(Continued)

(52) U.S. Cl.
CPC .............. *G06F 3/023* (2013.01); *G06F 3/02* (2013.01); *G06F 9/452* (2018.02); *H03M 11/00* (2013.01); *H03M 11/003* (2013.01)

(58) Field of Classification Search
CPC ... G06F 3/02; G06F 3/023; G06F 3/03; G06F 3/032; H03M 11/003; H03M 11/00; H03M 11/04; H03M 11/06; H03M 11/08
(Continued)

(56) References Cited

U.S. PATENT DOCUMENTS 6,715,086 B1 *  3/2004  Himmel ................ G06F 21/316
                                                              327/263
7,937,470 B2    5/2011  Curley
(Continued)

FOREIGN PATENT DOCUMENTS

EP          1548590 A2     6/2005

OTHER PUBLICATIONS

Extended European Search Report received in EP Application No. 16890065.2, dated May 14, 2018, 7 pages.
(Continued)

*Primary Examiner* — Alexander Eisen
*Assistant Examiner* — Nelson Lam
(74) *Attorney, Agent, or Firm* — Hewlett Packard Enterprise Patent Department

(57) ABSTRACT

Various implementations relate to keyboard data communicated from a client device to a remote access manager. For example, the remote access manager may receive the keyboard data via a communication channel. The keyboard data may include key down states. The remote access manager may insert a key up state after each key down state in the received keyboard data to generate modified keyboard data.

20 Claims, 9 Drawing Sheets

(51) Int. Cl.
*H03M 11/00* (2006.01)
*G06F 3/02* (2006.01)

(58) Field of Classification Search
USPC .................................................. 345/168–179
See application file for complete search history.

(56) References Cited

U.S. PATENT DOCUMENTS

| | | | |
|---|---|---|---|
| 9,032,096 | B2 | 5/2015 | Jawahar |
| 9,176,595 | B2 | 11/2015 | Chao |
| 2002/0026428 | A1* | 2/2002 | Ishikawa ............... G06Q 20/20 705/73 |
| 2002/0118223 | A1* | 8/2002 | Steichen ................ G06F 3/033 715/745 |
| 2005/0030289 | A1* | 2/2005 | Crockett ................ G06F 3/023 345/168 |
| 2005/0057521 | A1* | 3/2005 | Aull ...................... G06F 3/0219 345/172 |
| 2008/0238728 | A1 | 10/2008 | Motoe |
| 2010/0306427 | A1 | 12/2010 | Cao et al. |
| 2012/0253701 | A1 | 10/2012 | Michaelis et al. |
| 2014/0189091 | A1 | 7/2014 | Tamasi et al. |
| 2014/0365214 | A1* | 12/2014 | Bayley ................... G10L 15/26 704/235 |
| 2015/0208013 | A1 | 7/2015 | Friedrich |
| 2015/0242291 | A1* | 8/2015 | Chang ................ G06F 11/2023 714/6.3 |
| 2018/0046535 | A1* | 2/2018 | Konno ................ G06F 11/0787 |
| 2018/0302407 | A1* | 10/2018 | Sekaran ................ G06F 21/604 |
| 2019/0356655 | A1* | 11/2019 | Parthiban ............ H04L 63/0861 |

OTHER PUBLICATIONS

International Search Report & Written Opinion received in PCT Application No. PCT/US2016/017667, dated Nov. 4, 2016, 13 pages.
Morse, D. J. et al., "Configuring Low-Latency Environments on Dell PowerEdge Servers" Jun. 2011 7 pages, http://www.dell.com/downloads/global/products/pedge/en/configuring_dell_powerEdge_servers_for_low_latency_12132010_final.pdf.
Neteffect, "Understanding iWARP: Eliminating Overhead and Latency in Multi-Gb Ethernet Networks," Sep. 27, 2007, 5 pages, http://download.intel.com/support/network/adapter/pro100/sb/understanding_iwarp.pdf.
Firmware Specification, "USB Device Class Definition for Human Interface Devices (HID)", Version 1.11, Jun. 27, 2001, 98 pages.
Microsoft Docs, "NET Socket Class Reference", available online at <https://web.archive.org/web/20150118092134/http://msdn.microsoft.com/en-us/library/attbb8f5.aspx>, Jan. 18, 2015, 8 pages.
Microsoft Support, "Characters Repeat Several Times in a Remote Desktop Session", available online at <https://web.archive.org/web/20150109055414/http://support.microsoft.com/kb/831521>, Jan. 9, 2015, 1 page.
Margaret Rouse, "Baseboard Management Controller (BMC)," May 2007, pp. 1-4, TechTarget, Retrieved from the Internet on May 4, 2020 at URL: <searchnetworking.techtarget.com/definition/baseboard-management-controller>.
Wikipedia, "Intelligent Platform Management Interface," Jan. 22, 2016, pp. 1-8, Retrieved from the Internet on May 4, 2020 at URL: <en.wikipedia.org/w/index.php?title=Intelligent_Platform_Management_Interface&oldid=701077563#Baseboard_management_controller>.

* cited by examiner

GENERATING MODIFIED KEYBOARD DATA RECEIVED FROM A CLIENT DEVICE TO REDUCE UNINTENDED KEY REPETITION

BACKGROUND

A server may include a baseboard management controller that provides out-of-band management capabilities. A client device may communicate with the baseboard management controller via a network connection. The baseboard management controller may relay data from the client device to a host environment of the server.

BRIEF DESCRIPTION OF THE DRAWINGS

Various examples will be described below with reference to the following figures.

Throughout the drawings, identical reference numbers may designate similar, but not necessarily identical, elements.

DETAILED DESCRIPTION

Some servers may include a baseboard management controller that provides out-of-band management capabilities. The baseboard management controller also may communicate with a host environment of a server. A client device (e.g., a computer) may communicate with the baseboard management controller via a network connection and/or other communication technologies.

In particular, a user may type on a keyboard and a remote console session executing on the client device may send keyboard data to the baseboard management controller. For example, when a key is pressed, the client device sends a packet indicating a key down state for that key. When the key is released, the client device sends another packet indicating a key up state for that key. Accordingly, for a momentary key press intended to register a single character or the like, the delay between the key down and key up packets should be short. The baseboard management controller may pass those packets as received, via keyboard emulation, to an operating system of the server.

However, in some cases, network latency between the client device and the server may lengthen the delay between the key down and key up packets to a point where the operating system interprets the key down state as indicating a key being held down. In turn, the operating system erroneously initiates a key repeat (i.e., multiple instances of the same key), instead of registering a single key press as intended. Unintentional key repetition may be undesirable from a user experience standpoint.

Approaches to compensate for erroneous key repeats include lengthening the key repeat delay at the remote server or disabling key repeats at the remote server, which require additional server configuration and may not work in environments without configuration utilities. Another approach is to transmit characters rather than key codes with key down/key up states, but transmitting characters may result in network overhead and may depend on keyboard language or layout settings.

Example techniques of the present disclosure may relate to a remote access manager, such as a baseboard management controller, that modifies keyboard data. For example, in some implementations, the remote access manager may receive keyboard data arriving from a client device via a communication channel and a communication interface, and may insert a key up state after each key down state in the received keyboard data to generate modified keyboard data. The modified keyboard data may be passed on to a host system. Accordingly, the systems and techniques of the present disclosure may be useful for relaying keyboard data from a client device to a host system with reduced incidences of unintended key repetition due to network latency.

Figure 1A:
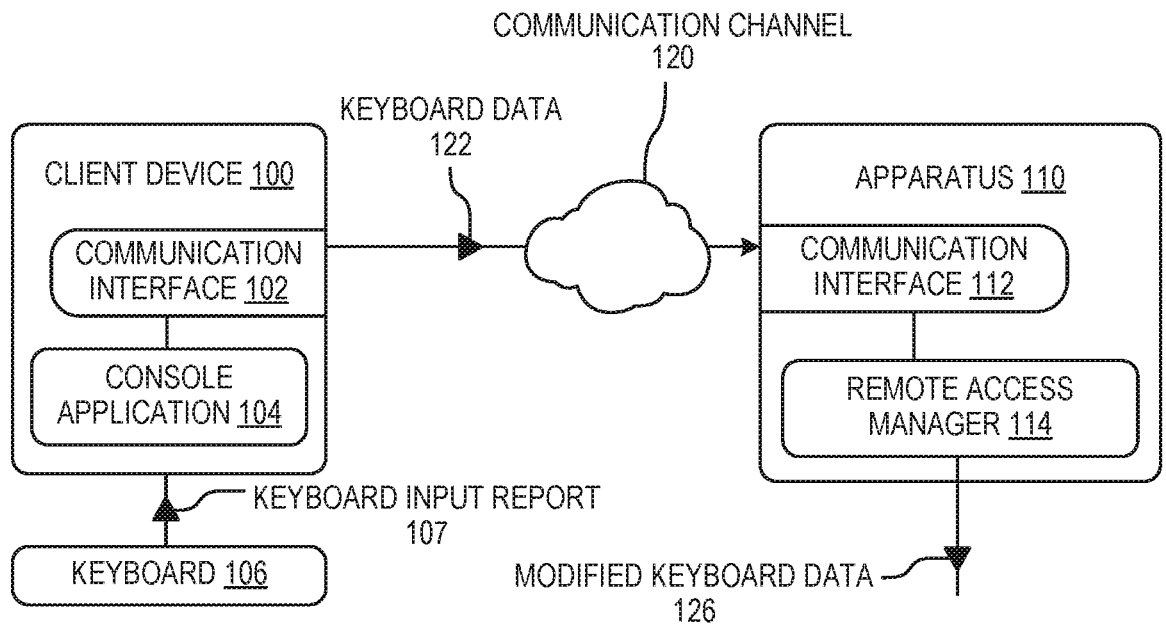
FIG. 1A is a block diagram depicting a client device communicating keyboard data with an apparatus having a remote access manager, according to an example implementation.

Referring now to the figures, FIG. 1A depicts a client device 100 that communicates with an apparatus 110 via a communication channel 120. The communication channel 120 may employ any wired and/or wireless communication technology (e.g., Ethernet, USB or Universal Serial Bus, optical fiber, FireWire®, Thunderbolt™, Wi-Fi®, Bluetooth®, ZigBee®, infrared, or the like), and may include combinations of communication technologies. The client device 100 and the apparatus 110 include communication interface 102 and 112, respectively, for communicating on the channel 120. For example, the communication interfaces 102, 112 may include an Ethernet interface, a Wi-Fi interface, a USB interface, etc.

A keyboard 106 may be connected to the client device 100, and the keyboard 106 may send a keyboard input report to the client device 100 indicating which keys have been pressed and/or are being held down. The keyboard input report may be formatted according to a specification such as the Universal Serial Bus Device Class Definition for Human Interface Devices Version 1.11 (referred to herein as HID 1.11), in which case the keyboard input report may comprise eight bytes of data (bytes 0 through 7). Byte 0 may include eight bits representing eight modifier keys (left control, left shift, left alt, left GUI, right control, right shift, right alt, and right GUI), where a "0" or "1" for a bit respectively indicates that a corresponding modifier key is pressed or not pressed. Byte 1 may be reserved for OEM use. Bytes 2 through 7 may each report a key code representing a key that is pressed, for a total of up to six key codes reported simultaneously. For example, if the letter "a" is pressed, a hex code of "04" may be reported in one of the bytes 2 through 7.

A keyboard input report indicating that a key is pressed (bit(s) of byte 0 set to "1" and/or a non-zero value in any of bytes 2 through 7) may be referred to as a "key down state" for the key(s) represented in that report. A keyboard input report indicating that a key is not pressed (bit(s) of byte 0 set to "0" and/or zero values in the bytes 2 through 7) may be referred to as a "key up state", particularly if a key was reported as pressed in a preceding report. In other words, a key up state for a particular key code is a key report that clears a key down state for that particular key code (i.e., the previously reported key code is absent from the report). Other keyboard specifications other than HID 1.11 also may be utilized to report key presses, such as another standard or a proprietary specification.

A key may be actuated in at least two ways: pressed (i.e., momentarily) or held down. In some implementations, if a key (e.g., the "a" key) is pressed, the keyboard 106 issues a keyboard input report 107 indicating a key down for the key (e.g., hex key code "04" for letter "a" in byte 2) followed by a keyboard input report 107 indicating a key up for that key (e.g., absence of hex key code "04" in the report). In some implementations, if a key (e.g., the "a" key) is held down, the keyboard 106 issues a keyboard input report 107 indicating a key down state for the key (e.g., hex key code "04" in byte 2) and will wait until the key is released before issuing a keyboard input report 107 clearing that key code. While the key is held down, other key(s) may be pressed or held down, and those other key(s) will appear in the keyboard input report 107 along with the held key.

The client device 100 may be executing a console application 104, which may be a set of machine readable instructions executed by a processing resource (e.g., central processing unit(s), an application specific integrated circuit, a microcontroller, etc.). The console application 104 may access or receive the keyboard input report 107 from the keyboard 106, via an operating system or kernel of the client device 100. The console application 104 can interpret the keyboard input report 107, and various keystrokes in the report may trigger different functionalities of the console application 104 (e.g., menus, options, commands, etc.) or may be interpreted as text input (e.g., for a text editor, text input field, command line interface, etc.).

The console application 104 also may transmit the keyboard input report 107 as keyboard data 122 to the apparatus 110 via the communication interface 102 and communication channel 120. In some implementations, the console application 104 may format the keyboard input report 107 prior to sending as keyboard data 122. For example, the console application 104 may omit key up states from the keyboard data 122 or may insert a key repetition indicator into the keyboard data 122. Examples of the console application 104 will be described further herein below (e.g., with respect to FIGS. 2-4).

The apparatus 110 may receive keyboard data transmitted by the console application 104. More particularly, the apparatus 110 may include a remote access manager 114 that receives the keyboard data 122 via the communication interface 112 and modifies the keyboard data 122 by inserting a key up state after each key down state to generate modified keyboard data 126. Examples of the apparatus 110 will be described further herein below (e.g., with reference to FIGS. 5 and 6).

In some implementations, the client device 100 may be or may form part of a server, a workstation, a terminal, a desktop computer, a laptop computer, a mobile/portable device, a computing device, or other electronic device. The apparatus 110 may be or may form part of a device that receives keyboard data 122 over a communication channel 120 from the client device 100. For example, the apparatus 110 may be or may form part of a keyboard-video-mouse (KVM) component, such as a KVM switch (also referred to as a KVM-over-IP switch). In some examples, the apparatus 110 may be or may form part of a baseboard management controller or a remote desktop application, which will be described further herein with reference to FIG. 1B.

Figure 1B:
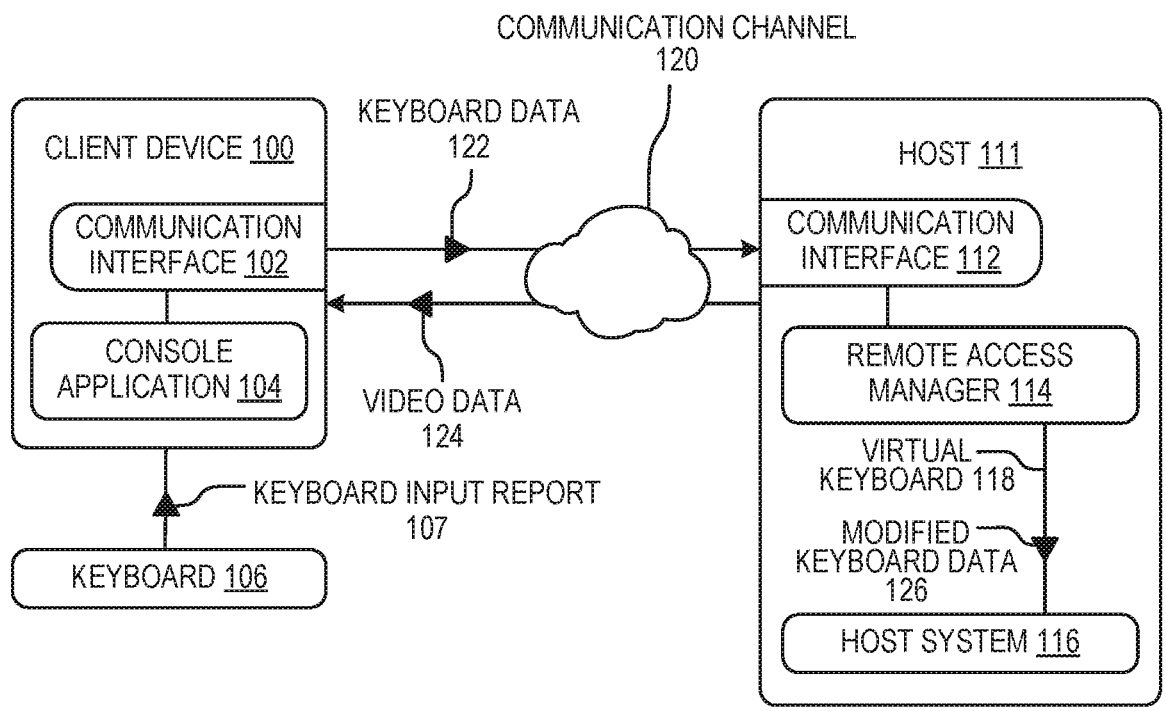
FIG. 1B is a block diagram depicting a client device communicating keyboard data with a host having a remote access manager, according to an example implementation.

FIG. 1B depicts a client device 100 that communicates (send and receive data) with a host 111 via communication channel 120. In particular, the client device 100 may transmit keyboard data 122 to the host 111. The host 111 may transmit data to the client device 100, such as video data 124. In some examples, channel 120 may also carry data from other I/O peripherals of the client device 100, such as a mouse or other pointer device. Thus, these communications may be referred to generally and collectively as Keyboard, Video, Mouse (KVM) data.

The host 111 may be or may form part of a server (e.g., a compute and/or storage system), or other type of computing system. The host 111 may include the communication interface 112, the remote access manager 114, and a host system 116. As described above, the remote access manager 114 may, among other things, modify the keyboard data 122 received by communication interface 112 by inserting a key up state after each key down state to generate modified keyboard data 126.

The host 111 may include a host system 116, which may be, for example, an operating system or an operating environment, including any applications executing thereon. The remote access manager 114 may pass on received keyboard data 122 or the modified keyboard data 126 to the host system 116. In some implementations, the remote access manager 114 may present keyboard data 122 to the host system 116 via a virtual keyboard 118, that is, the remote access manager 114 may emulate a physical keyboard device and present an emulated keyboard input report to the host system 116 via a peripheral or I/O device interface (e.g., USB). The remote access manager 114 may also transmit video data 124 to the client device 100 and/or the console application 104, the video data 124 reflecting a current state of the host system 116. For example, the video data 124 may include text (e.g., ASCII codes, Unicode codes, etc.), graphics (e.g., pixels, vectors, images, motion video, etc.), or other displayable data. Thus, by virtue of exchanging the keyboard data 122 and the video data 124, a user may remotely see and control the operation of the host system 116 (or more generally, the host 111) through the console application 104.

In some implementations, the remote access manager 114 may be or may form part of a remote desktop application. A remote desktop application may be machine readable instructions executed by a processor of the host 111 to coordinate display of the host system 116 on a remote device, such as the client device 100, via video data 124 and receives input from the remote device (e.g., keyboard data 122 and other peripheral data) to control the host system 116. As a remote desktop application, the remote access manager 114 may be an application executing within the operating system of the host 111.

In some implementations, the remote access manager 114 may be or may form part of a baseboard management controller (which may also refer to a lights out management controller, remote management controller, or the like). A baseboard management controller may communicate with another computing device, such as client device 100, via an out-of-band communication path. For example, the client device 100 may communicate with the remote access manager 114 via an out-of-band communication path, such that a user of the client device 100 can remotely manage aspects of the host 111, such as firmware or hardware settings, remote rebooting, remote installation, system diagnostics, and logging. By virtue of communicating with the remote access manager 114 via the out-of-band communication path, the user at the client device 100 may manage the host 111 during normal operation of the host 111 and/or host system 116, in the event of a failure of the host 111 and/or host system 116, or even when the host 111 has been powered off and the host system 116 is not running. By contrast, in-band communication between the client device 100 and the host 111 may be effective exclusively within normal operation of the host 111 (e.g., when the host system 116 is running). As a baseboard management controller, the remote access manager 114 may operate independently and separately from the host system 116. In some implementations, the communication interface 112 may include interfaces to the in-band and out-of-band communication paths.

Figure 2:
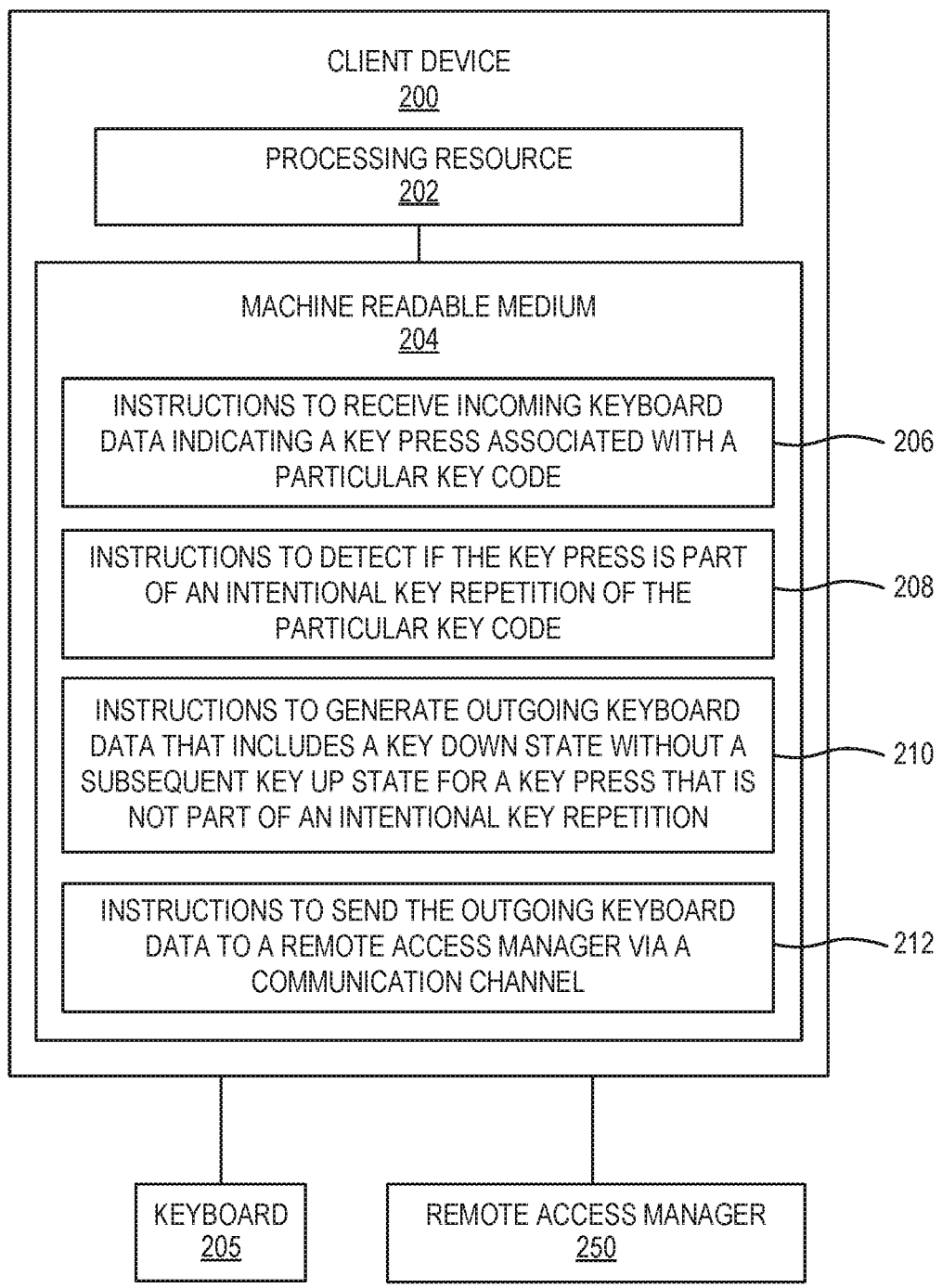
FIG. 2 is a block diagram of an example client device that sends keyboard data to a remote access manager, according to an implementation.

FIG. 2 is a block diagram of an example client device 200 that sends keyboard data to a remote access manager, according to an implementation. The client device 200 includes a processing resource 202 coupled to a non-transitory machine readable medium 204 storing (or encoded with) instructions 206, 208, 210, 212. The term "non-transitory" does not encompass transitory propagating signals. The client device 200 may be or may form part of a computing system (e.g., a server, a workstation, a desktop computer, a laptop computer, a mobile/portable device, etc.), and may serve as or form part of the client device 100 described above.

In some implementations, the processing resource 202 may be a microcontroller, a microprocessor, central processing unit (CPU) core(s), an application-specific integrated circuit (ASIC), a field programmable gate array (FPGA), and/or other hardware device suitable for retrieval and/or execution of instructions stored on the machine readable medium 204. The machine readable medium 204 may be random access memory (RAM), read-only memory (ROM), electrically erasable programmable read-only memory (EEPROM), flash memory, a hard disk drive, etc. The instructions 206, 208, 210, 212, when executed, cause the processing resource 202 to perform the functionality described herein. Additionally or alternatively, the processing resource 202 may include one or more hardware devices, including electronic circuitry, for implementing functionality described herein.

The client device 200 may be connected to a keyboard 205. Additionally, the client device 200 may communicate with a remote access manager 250, which may be analogous in many respects to the remote access manager 114 described above, or a remote access manager to be described below with reference to FIG. 5 or 6. For example, the client device 200 may communicate with the remote access manager 250 via a communication channel and communication interfaces.

Instructions 206, when executed, cause the processing resource 202 to receive incoming keyboard data indicating a key press on a keyboard 205 connected to the client device 200. The key press may be associated with a particular key code (e.g., a number, a letter, a symbol, etc.). For example, the incoming keyboard data may be a multi-byte keyboard input report adhering to a format such as HID 1.11 described above or the like. Instructions 206 may receive plural sets of incoming keyboard data, for example, as often as the keyboard 205 issues the incoming keyboard data. Additionally, the incoming keyboard data may indicate simultaneous key presses.

Instructions 208, when executed, cause the processing resource 202 to detect if the key press indicated in the incoming keyboard data is part of an intentional key repetition of the particular key code. In some implementations, an intentional key repetition may be detected when an incoming keyboard data reporting the particular key code (key down state) is not followed by another incoming keyboard data clearing the particular key code (key up state) within a predetermined amount of time (e.g., a "key repeat delay" in the range of 250 milliseconds to 2 seconds). For example, instructions 208 may employ a timer triggered to start by a key down state and triggered to stop by a key up state.

Instructions 210, when executed, cause the processing resource 202 to generate outgoing keyboard data that includes a key down state without a subsequent key up state for a key press that is not part of an intentional key repetition. For example, in some implementations, a key press that is not part of an intentional key repetition may appear in incoming keyboard data as a key down state followed closely by a key up state. In such an implementation, instructions 210 generate an outgoing keyboard data by retaining the key down state from the incoming keyboard data and discarding the key up state. In some implementations, instructions 210 may discard key up states related to key codes (e.g., bytes 2 through 7 in HID 1.11 format), but retain key up states related to modifier keys (byte 0 in HID 1.11 format) for inclusion in the outgoing keyboard data. In some implementations, the outgoing keyboard data may adhere to the same format as the incoming keyboard data, such as HID 1.11.

Instructions 212, when executed, cause the processing resource 202 to send (transmit) the outgoing keyboard data via a communication channel to the remote access manager 250. In the case where the outgoing keyboard data adheres to a format such as HID 1.11, the stream of outgoing keyboard data may be a stream of discrete packets and the order in which the outgoing keyboard data is sent corresponds to the order in which incoming keyboard data is received by instructions 206. That is, the order of key presses received from the keyboard 205 is preserved in transmission to the remote access manager 250 as outgoing keyboard data. In some implementations, the outgoing keyboard data may be sent to the remote access manager 250 as a stream or series of data (e.g., discrete packets) with a timing that is the same or similar (e.g., within a tolerance on the order of milliseconds or less) to a timing of the incoming keyboard data as received from the keyboard 205.

Figure 3:
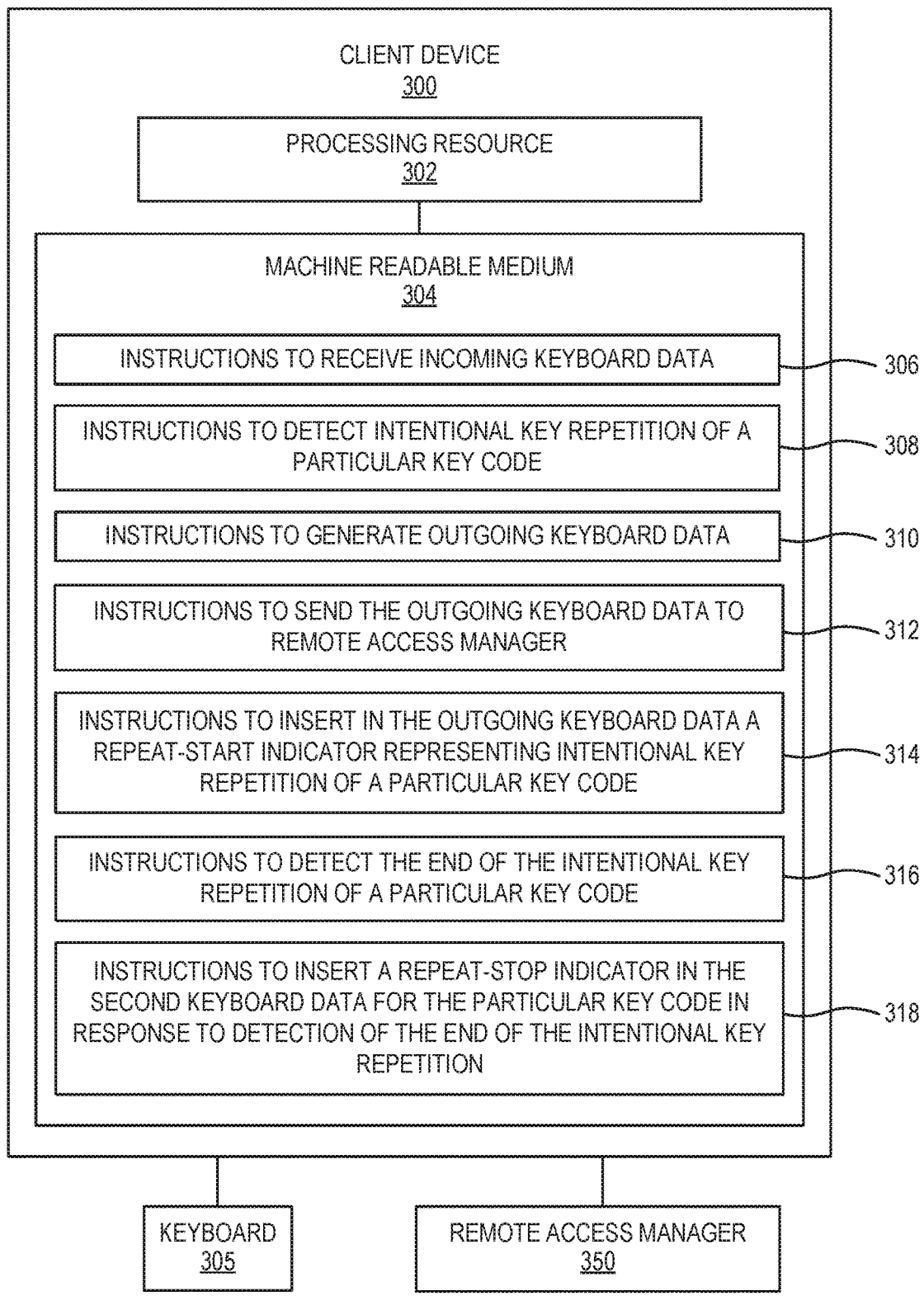
FIG. 3 is a block diagram of an example client device that inserts a repeat-start indicator into keyboard data, according to an implementation.

FIG. 3 is a block diagram depicting an example client device 300 that inserts a repeat-start indicator into keyboard data, according to an implementation. The client device 300 includes a processing resource 302 coupled to a non-transitory machine readable medium 304, which may be analogous in many respects to the processing resource 202 and the machine readable medium 204, respectively. The client device 300 may be connected to a keyboard 305 and may communicate with a remote access manager 350 (analogous in many respects to the manager 114). The client device 300 may be or may form part of a computing system, and may serve as or form part of the client device 100 described above.

The machine readable medium 304 stores instructions 306, 308, 310, 312, 314, 316, 318. Instructions 306, 308, 310, 312 may be analogous in many respects, respectively, to instructions 206, 208, 210, 212 described above. For example, instructions 306, when executed, cause the processing resource 302 to receive incoming keyboard data from keyboard 305, indicating a key press associated with a particular key code. Instructions 308, when executed, cause the processing resource 302 to detect if the key press is part of an intentional key repetition of the particular key code. Instructions 310, when executed, cause the processing resource 302 to generate outgoing keyboard data that includes a key down state without a subsequent key up state for a key press that is not part of an intentional key repetition. Instructions 312, when executed, cause the processing resource 302 to send the outgoing keyboard data to the remote access manager 350 via a communication channel.

If the key press is detected to be part of an intentional key repetition of the particular key code by instructions 308, then instructions 314 are triggered to cause the processing resource 302 to insert in the outgoing keyboard data a repeat-start indicator representing intentional key repetition of the particular key code. In some implementations, the repeat-start indicator may be consecutive key down states (e.g., two or more key down states) for the particular key code, without any intervening key up state. More particularly, the repeat-start indicator may be consecutive identical key reports. Alternatively or additionally, the repeat-start indicator may be a flag or other data that indicates the start of intentional repetition of the particular key code. The outgoing keyboard data with repeat-start indicator may be transmitted to the remote access manager 350 by instructions 312.

Instructions 316, when executed, cause the processing resource 302 to detect the end of the intentional key repetition of the particular key code. For example, instructions 316 may detect in incoming keyboard data a key up state for a particular key code previously detected by instructions 308 to be part of an intentional key repetition. Such a key up state indicates the end of the intentional key repetition.

Instructions 318, when executed, cause the processing resource 302 to insert a repeat-stop indicator in the outgoing keyboard data for the particular key code in response to detection of the end of the intentional key repetition of the particular key code by instructions 316. In some implementations, the repeat-stop indicator is a key up state that clears the particular key code in the outgoing keyboard data. Alternatively or additionally, the repeat-stop indicator may be a flag or other data that indicates the end of the intentional key repetition. The outgoing keyboard data with repeat-stop indicator may be transmitted to the remote access manager 350 by instructions 312.

Figure 4:
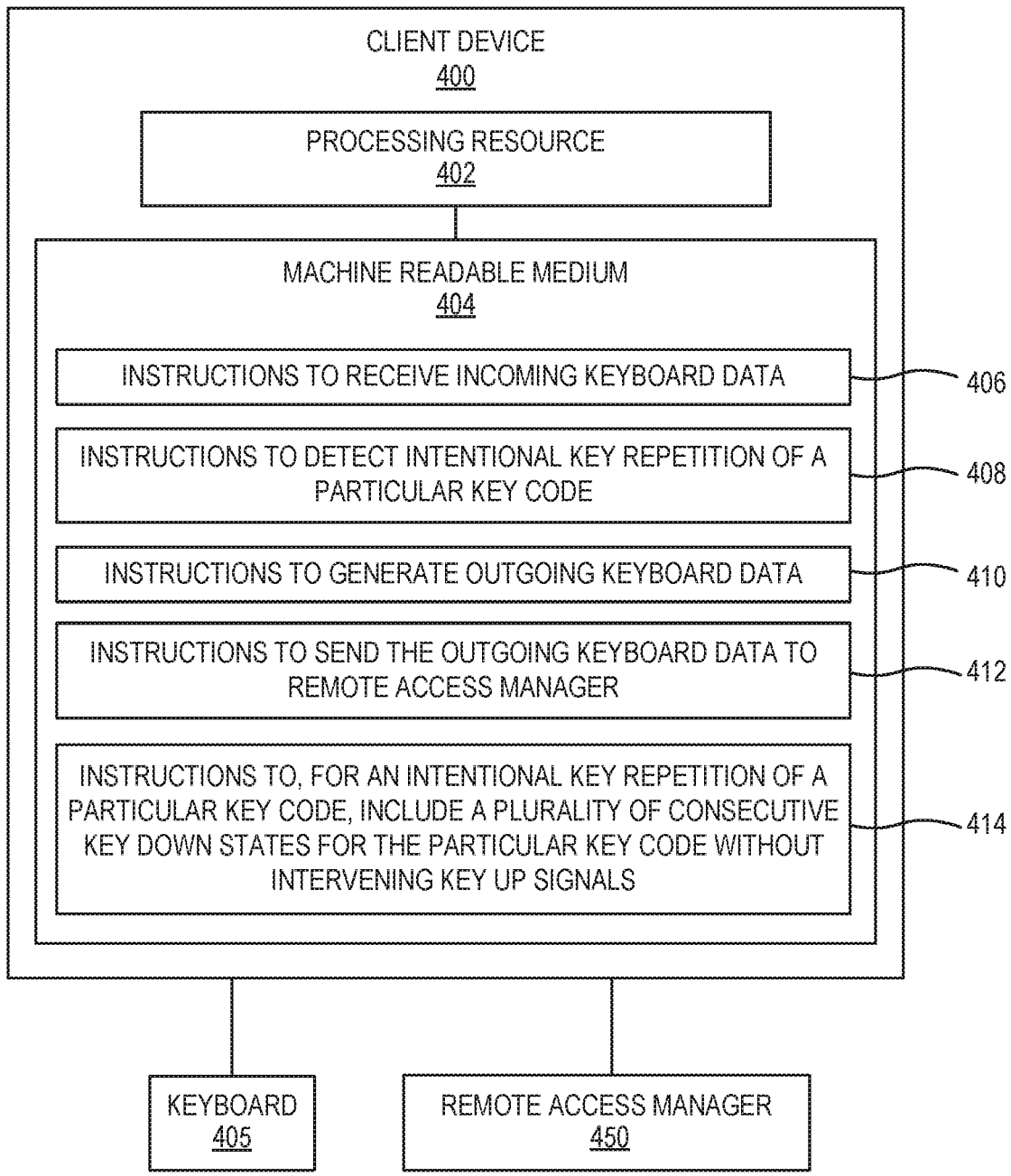
FIG. 4 is a block diagram of an example client device that includes in keyboard data a plurality of consecutive key down states for an intentional key repetition, according to an implementation.

FIG. 4 is a block diagram depicting an example client device 400 that includes in keyboard data a plurality of consecutive key down states for an intentional key repetition, according to an implementation. The client device 400 includes a processing resource 402 coupled to a non-transitory machine readable medium 404, which may be analogous in many respects to the processing resource 202 and the machine readable medium 204, respectively. The client device 400 may be connected to a keyboard 405 and may communicate with a remote access manager 450 (analogous in many respects to the manager 114). The client device 400 may be or may form part of a computing system, and may serve as or form part of the client device 100 described above.

The machine readable medium 404 stores instructions 406, 408, 410, 412, 414. Instructions 406, 408, 410, 412 may be analogous in many respects, respectively, to instructions 206, 208, 210, 212 described above. For example, instructions 406, when executed, cause the processing resource 402 to receive incoming keyboard data from keyboard 405, indicating a key press associated with a particular key code. Instructions 408, when executed, cause the processing resource 402 to detect if the key press is part of an intentional key repetition of the particular key code. Instructions 410, when executed, cause the processing resource 402 to generate outgoing keyboard data that includes a key down state without a subsequent key up state for a key press that is not part of an intentional key repetition. Instructions 412, when executed, cause the processing resource 402 to send the outgoing keyboard data to the remote access manager 450 via a communication channel.

If the key press is detected by instructions 408 to be part of an intentional key repetition of the particular key code, instructions 414, when executed, cause the processing resource 402 to include (in other words, insert or issue) in the outgoing keyboard data a plurality of consecutive key down states for the particular key code without intervening key up states for the particular key code. Instructions 414 may issue the consecutive key down states in the outgoing keyboard data at a key repeat rate native to the client device 400. In some implementations, instructions 414 may stop including consecutive key down states for the particular key code upon detecting the end of the intentional key repetition of the particular key code in incoming keyboard data (e.g., in a manner analogous to instructions 316). As will also be described below, the remote access manager 450 may receive the outgoing keyboard data and insert key up states between the consecutive key down states of the intentional key repetition.

At least some of the client instructions of the client devices 200, 300, or 400 may form part of the console application 104 of the client device 100 described above with reference to FIGS. 1A and 1B. In some implementations, various instructions of the client devices 200, 300, and/or 400 may be combined to form part of the console application 104.

Figure 5:
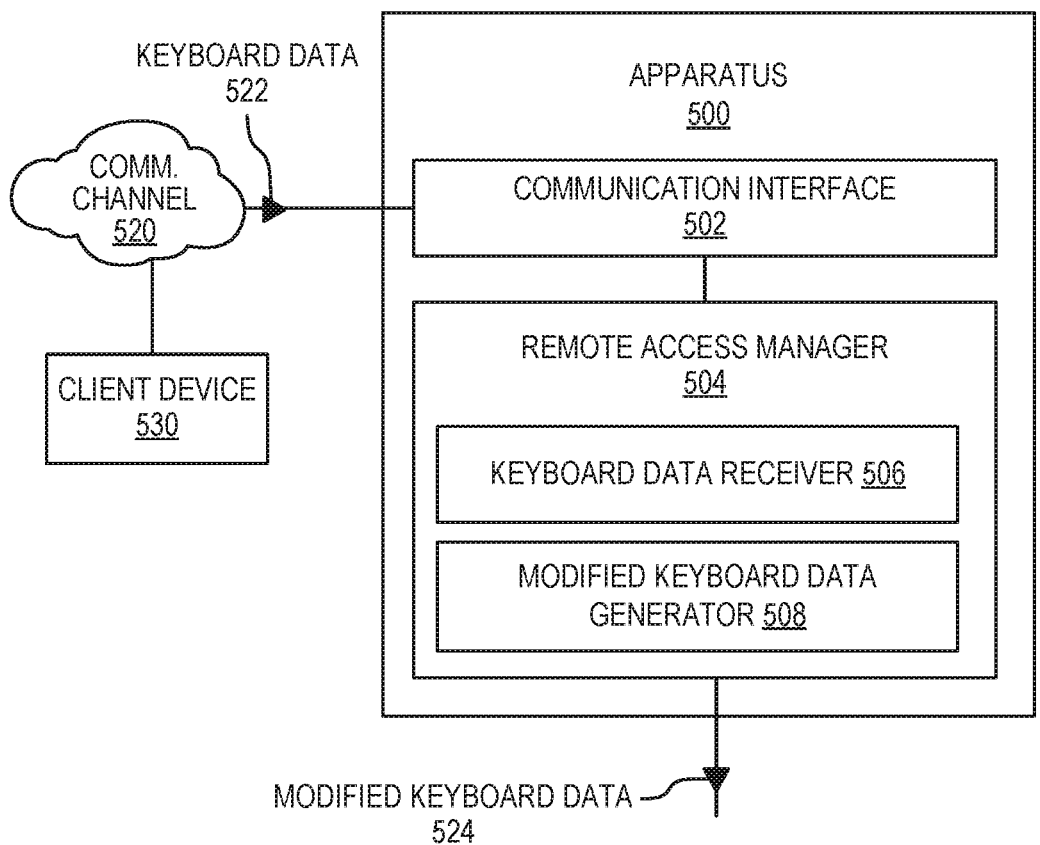
FIG. 5 is a block diagram of an example apparatus that includes a modified keyboard data generator, according to an implementation.

FIG. 5 is a block diagram of an example apparatus 500. The apparatus 500 includes a communication interface 502 and a remote access manager 504. The apparatus 500 may serve as or form part of the apparatus 110 or the host 111. In particular, the communication interface 502 and the remote access manager 504 may serve as or form part of the communication interface 112 and the remote access manager 114, respectively. In some implementations, the remote access manager 504 may be included in a baseboard management controller, a remote desktop application, or a network KVM component.

The communication interface 502 may employ any wired and/or wireless communication technology, and may include combinations of communication technologies (e.g., in a single interface or in multiple interfaces). In some examples, the communication interface 502 may include an adapter, a controller, or other similar hardware-based device.

The apparatus 500 may communicate with a communication channel 520 by virtue of the communication interface 502. That is, the communication interface 502 may be compatible with the wired and/or wireless communication technology or technologies employed by the communication channel 520. In particular, the apparatus 500 may communicate over the communication channel 520 with a client device 530. The client device 530 may be analogous in many respects to the client devices 100, 200, 300, or 400 described above. For example, the client device 530 may transmit keyboard data 522 to the apparatus 500, and such keyboard data 522 may be analogous in many respects to the keyboard data 122 or the outgoing keyboard data described above with respect to FIGS. 2-4.

The remote access manager 504 may be coupled to the communication interface 502. By virtue of such coupling, the remote access manager 504 may communicate (send and receive data) over the communication channel 520 via the communication interface 502.

The remote access manager 504 includes a keyboard data receiver 506 and a modified keyboard data generator 508. The keyboard data receiver 506 and the modified keyboard data generator 508 each may be any combination of hardware and programming to implement their respective functionalities as described herein. For example, the programming may be executable instructions stored on a non-transitory machine readable storage medium and the hardware for the components may include a processing resource to retrieve and/or execute those instructions. For example, the processing resource may be a microcontroller, a microprocessor, CPU core(s), an ASIC, an FPGA, and/or other hardware device suitable for retrieval and/or execution of instructions from the machine readable storage medium. Additionally or alternatively, the keyboard data receiver 506 and the modified keyboard data generator 508 may include one or more hardware devices including electronic circuitry or logic for implementing functionality described herein.

The keyboard data receiver 506 receives keyboard data 522 arriving at the communication interface 502 from a client device 530 via the communication channel 520. In some examples, the keyboard data receiver 506 may extract keyboard data 522 from among other data transmitted by the client device 530 (e.g., by examining packet headers).

The keyboard data 522 may be a packet or packets of data and may be formatted according to a specification such as HID 1.11 or any other specification. In some implementations, the received keyboard data 522 generally includes a key down state (e.g., key codes representing keys presses at the client device 530) without a subsequent key up state to clear that key down state. For example, the keyboard data 522 may be similar to the outgoing keyboard data transmitted by instructions 212. In other implementations, the keyboard data 522 includes a key up state following a key down state, for a key press at the client device 530. The keyboard data receiver 506 may push the received keyboard data 522 to the modified keyboard data generator 508 in some cases.

The modified keyboard data generator 508 takes the keyboard data 522 received by the keyboard data receiver 506 and inserts a key up state after each key down state in the keyboard data 522 to generate modified keyboard data 524. In implementations where the client device 530 issues, in the keyboard data 522, a key up state after a key down state for a key press, the modified keyboard data generator 508 may nevertheless insert a key up state.

As an illustration of the modified keyboard data generator 508, consider an example where a user types the word "cat" on a keyboard attached to the client device 530. The client device 530 generates (e.g., by instructions 210) and transmits (e.g., by instructions 212) keyboard data 522 representing the typing of the word "cat" to the apparatus 500. Under the HID 1.11 format, the keyboard data 522 received by the keyboard data receiver 506 may include the following three sequential key report packets:
[00 00 06 00 00 00 00 00]—"c" received
[00 00 04 00 00 00 00 00]—"a" received
[00 00 17 00 00 00 00 00]—"t" received The modified keyboard data generator 508 inserts a key up state after each key down state, and accordingly the modified keyboard data 524 may include the following sequential key report packets:
[00 00 06 00 00 00 00 00]—"c" received
[00 00 00 00 00 00 00 00]—key up state inserted
[00 00 04 00 00 00 00 00]—"a" received
[00 00 00 00 00 00 00 00]—key up state inserted
[00 00 17 00 00 00 00 00]—"t" received
[00 00 00 00 00 00 00 00]—key up state inserted In some implementations, the remote access manager 504 may forward the modified keyboard data 524 to a host system. For example, in a manner similar to that described above with respect to FIG. 1B, the remote access manager 504 may be included in a host device (e.g., a server or other computing device) which runs a host system, such as an operating system or an operating environment. The remote access manager 504 may pass the modified keyboard data 524 to the host system by emulating a physical keyboard device to a peripheral or I/O interface. Moreover, as the keyboard data 522 may include sequential key report packets, the remote access manager 504 may preserve the relative order of those key report packets when passing the modified keyboard data 524 to the host system.

In some implementations, the modified keyboard data generator 508 inserts the key up state upon receipt of keyboard data 522 at the apparatus 500, in order to minimize delay between the key down state and the key up state intended to clear that key down state. In some implementations, when the modified keyboard data 524 is forwarded to a host system, the delay between a key down state and a key up state inserted afterwards is targeted to be at least less than the key repeat delay of the host system (e.g., a delay in the range of 250 milliseconds to 2 seconds).

By virtue of the modified keyboard data generator 508 inserting the key up state after transmission of the keyboard data 522 over the communication channel 520, a key press at the client device 530 (i.e., key down followed by a key up) may be presented to the host system accurately and errant key repetition caused by transmission latency in the communication channel 520 may be reduced or eliminated.

Figure 6:
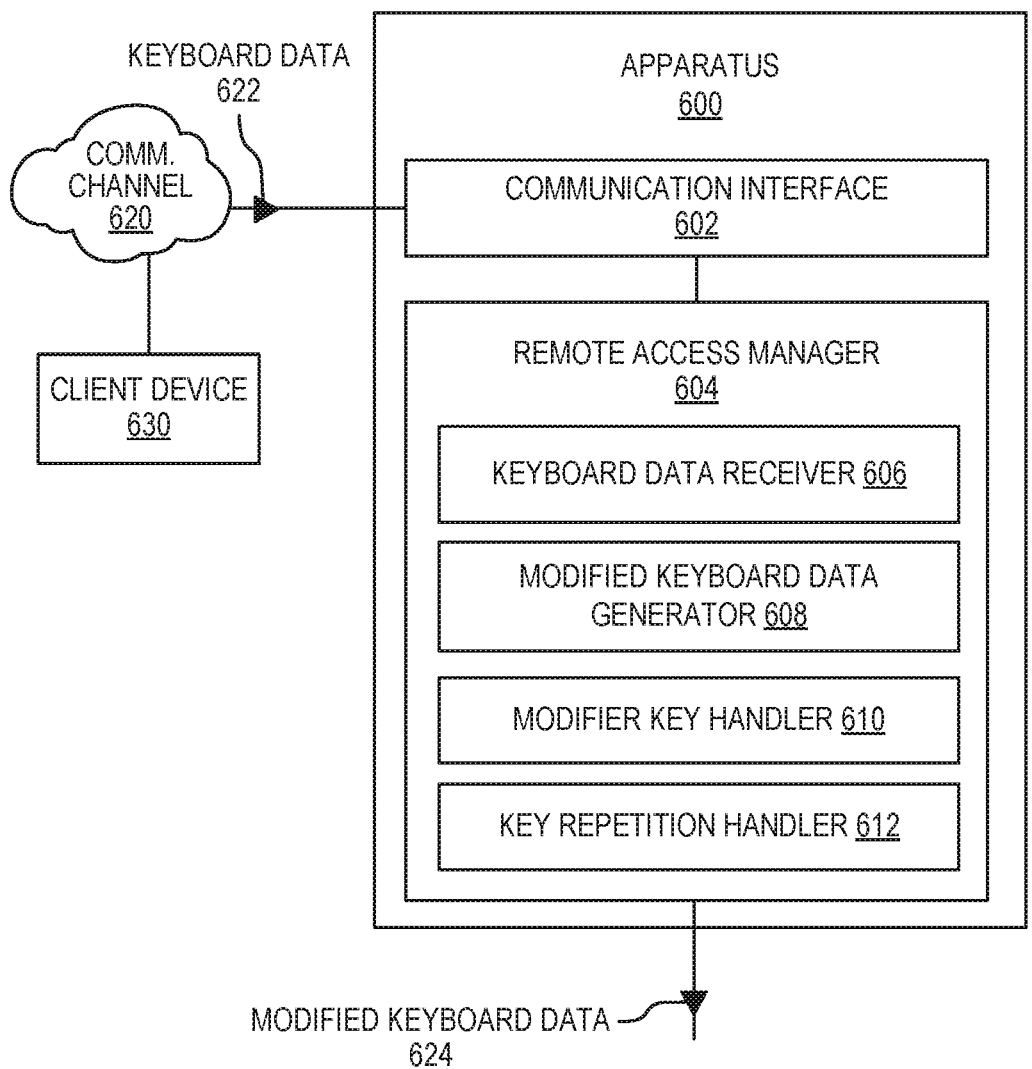
FIG. 6 is a block diagram of an example apparatus that includes a modifier key handler and a key repetition handler, according to an implementation.

FIG. 6 is a block diagram of an example apparatus 600. The apparatus 600 includes a communication interface 602 that may be analogous in many respects to the communication interface 502. For example, the communication interface 602 may receive keyboard data 622 from a client device 630 (analogous to client device 530) over communication channel 620 (analogous to channel 520).

The apparatus 600 also includes a remote access manager 604 coupled to the communication interface 602. The remote access manager 604 includes a keyboard data receiver 606, a modified keyboard data generator 608, a modifier key handler 610, and a key repetition handler 612, each of which may be any combination of hardware and programming (e.g., electronic circuitry, processing resource and machine readable instructions, etc.) to implement their respective functionalities as described herein.

In some implementations, the apparatus 600 may transmit modified keyboard data 624 generated by the remote access manager 604 as described below to a computing device or to a host system (e.g., via keyboard emulation). The keyboard data receiver 606 and the modified keyboard data generator 608 may be analogous in many respects to the keyboard data receiver 506 and the modified keyboard data generator 508 described above, but may differ to the extent that functionality is altered by the modifier key handler 610 and the key repetition hander 612.

The modifier key handler 610 detects if a key down state in the received keyboard data 622 is associated with a modifier key (e.g., left control, left shift, left alt, left GUI, right control, right shift, right alt, and right GUI), and excepts a key down state associated with a modifier key from insertion of a subsequent key up state by the modifier keyboard data generator 608. In other words, the modifier key handler 610 prevents the modified keyboard data generator 608 from automatically signaling a key up state for the detected modifier key. In some implementations, a key down state for a detected modifier key will be cleared by a key up state in the keyboard data 622, as described above with respect to instructions 210 of client device 200 for example. Accordingly, the apparatus 600 may be compatible with key combinations featuring a modifier key or modifier keys that are held down, such as control-alt-delete or the like.

To illustrate, consider an example where a user types the capitalized word "Cat" on a keyboard attached to the client device 630, by holding left shift, pressing "c", releasing left shift, pressing "a", and pressing "t". The client device 630 generates (e.g., by instructions 210) and transmits (e.g., by instructions 212) keyboard data 622 representing that typing of the word "Cat". Under the HID 1.11 format, the keyboard data 622 received by keyboard data receiver 606 may include the following sequential key report packets:

[40 00 00 00 00 00 00 00]—"left shift" key down received
[40 00 06 00 00 00 00 00]—"c" received
[00 00 00 00 00 00 00 00]—"left shift" key up received
[00 00 04 00 00 00 00 00]—"a" received
[00 00 17 00 00 00 00 00]—"t" received Upon receiving such keyboard data 622, the modified keyboard data generator 608 and the modifier key handler 610 may function together to generate the following modified keyboard data 624:

[40 00 00 00 00 00 00 00]—"left shift" key down received
[40 00 06 00 00 00 00 00]—"c" received
[40 00 00 00 00 00 00 00]—key up state for "c" inserted with "left shift" held
[00 00 00 00 00 00 00 00]—"left shift" key up received
[00 00 04 00 00 00 00 00]—"a" received
[00 00 00 00 00 00 00 00]—key up state inserted
[00 00 17 00 00 00 00 00]—"t" received
[00 00 00 00 00 00 00 00]—key up state inserted By virtue of the modifier key handler 610, the "left shift" key down is not automatically cleared with a key up state until the key up state for the "left shift" is received, thus allowing the "c" to be capitalized as intended.

The key repetition handler 612 of the remote access manager 604 is to allow a user to hold down a key (i.e., other than a modifier key) at the client device 630 and have that key repeated at the apparatus 600 and at any device or host system that receives modified keyboard data 624. Different client device implementations are described above for indicating intentional key repetition in outgoing keyboard data. For example, the client device 300 utilizes a repeat-start indicator and a repeat-stop indicator to mark the beginning and end of an intentional key repeat. The client device 400 includes a plurality of consecutive key down states for a repeated key code. The key repetition handler 612 may be implemented correspondingly.

For compatibility with the client device 300, the key repetition handler 612 may detect, in received keyboard data 622, a repeat-start indicator for a particular key code. In response to the detected repeat-start indicator, the key repetition handler 612 may trigger a key repeat of the particular key code at a host system. For example, as described above with respect to instructions 314, the repeat-start indicator may be consecutive key down states for the particular key code without any intervening key up state, a flag, or other indicator data. To trigger the key repeat to the host system, the key repetition handler 612 may allow a key down state for the particular key code in the modified keyboard data 624 without insertion of a key up state for the particular key code (e.g., by preventing modified keyboard data generator 608 from inserting a key up state). Accordingly, the host system may repeat the particular key code at the host system's native key repeat rate.

The key repetition handler 612 (compatible with client device 300) may also detect, in received keyboard data 622, a repeat-stop indicator (e.g., a key up state, a flag, etc.) occurring after the repeat-start indicator, and in response to the repeat-stop indicator, may cause the key repeat of the particular key code at the host system to stop. For example, the key repetition handler 612 may ensure a key up state clearing the particular key code is included in the modified keyboard data 624.

With the client device 400, the received keyboard data 622 includes repeated key down states for a same key code. Thus, the key repetition handler 612 may permit the modified keyboard data generator 608 to insert a key up state after each of the repeated key down states for the same key code to generate modified keyboard data 624.

Figure 7:
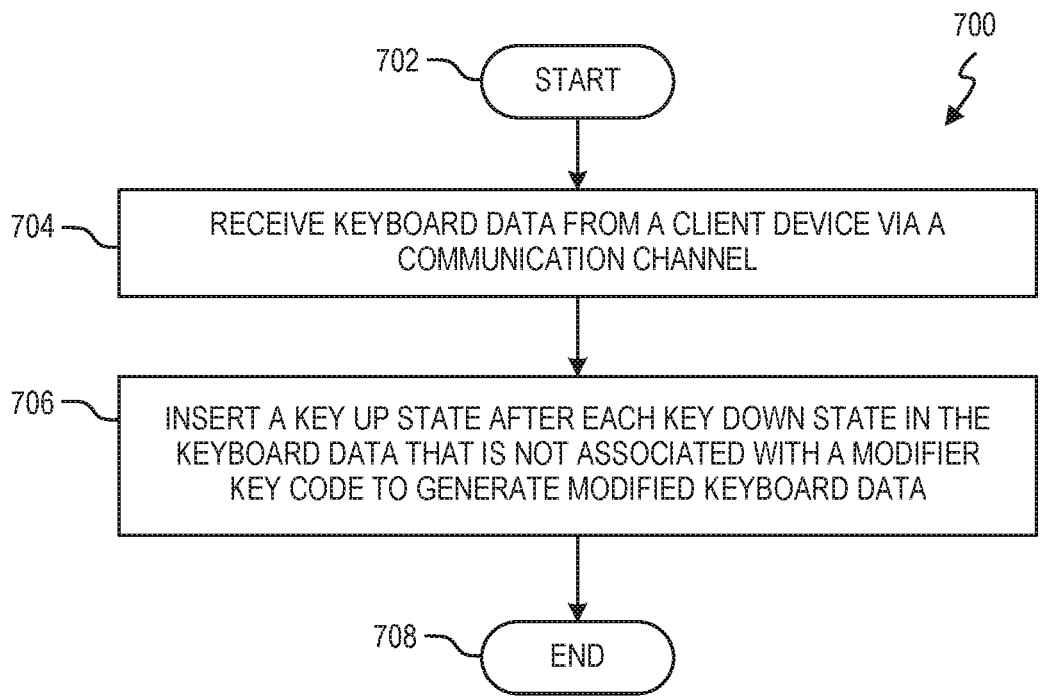
FIG. 7 is a flowchart of an example method for generating modified keyboard data, according to an implementation.

FIG. 7 is a flowchart of an example method 700 for generating modified keyboard data, according to an implementation. Method 700 may be implemented in the form of executable instructions stored on a machine readable medium and executed by a processing resource and/or in the form of electronic circuitry. For example, method 700 is described below as being performed by a remote access manager, such as the remote access manager 114 of FIG. 1. Various other remote access managers may perform method 700 as well, such as, for example, the remote access manager 504 or 604. In some implementations of the present disclosure, the blocks of method 700 may be executed substantially concurrently, may be ongoing, and/or may repeat.

The method 700 may begin at block 702, and continue to block 704, where a remote access manager (e.g., a baseboard management controller), receives keyboard data from a client device via a communication channel. In some implementations, the keyboard data receiver 506, 606 may perform block 702. The keyboard data may be similar, for example, in many respects to keyboard data 122, 522, or 622 described above or the outgoing keyboard data sent by instructions 212.

At block 706, the remote access manager may insert a key up state after each key down state in the keyboard data that is not associated with a modifier key code to generate modified keyboard data (similar to 126, 524, 624). In some implementations, the modified keyboard data generator 508, 608 may perform block 706. More particularly, block 706 may be performed by the modified keyboard data generator 608 in conjunction with the modifier key handler 610. The method 700 ends at block 708.

Figure 8:
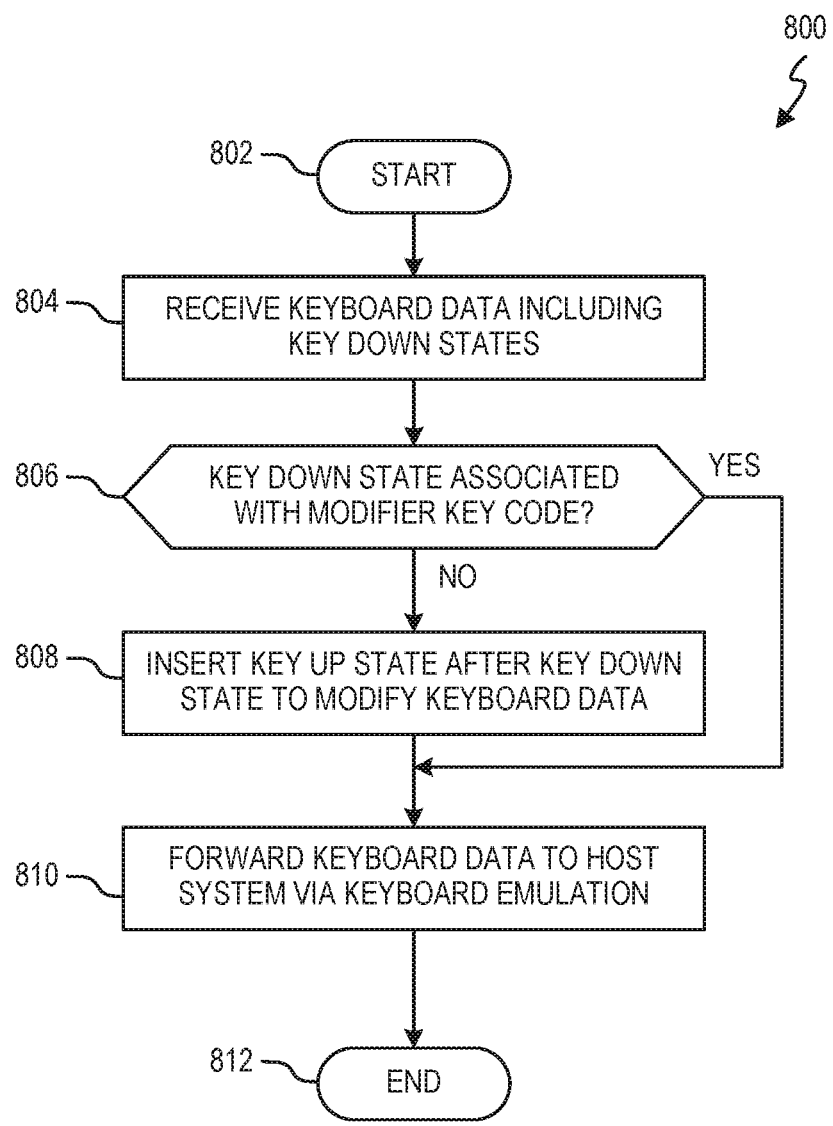
FIG. 8 is a flowchart of an example method that handles modifier keys while generating modified keyboard data, according to an implementation.

FIG. 8 is a flowchart of an example method 800 that handles modifier keys while generating modified keyboard data, according to an implementation. As with method 700, method 800 may be implemented in the form of executable instructions stored on a machine readable medium and executed by a processing resource and/or in the form of electronic circuitry. Method 800 may be performed, for example, by the remote access manager 114, 504, or 604, which may be a baseboard management controller for example. In some implementations of the present disclosure, one or more blocks of method 800 may be executed substantially concurrently or in a different order than shown in FIG. 8. Some of the blocks of method 800 may, at times, be ongoing and/or may repeat. In some implementations of the present disclosure, method 800 may include more or fewer blocks than are shown in FIG. 8.

The method 800 may begin at block 802 and continue to block 804, where the remote access manager receives keyboard data that includes key down states from a client device. Block 804 may be analogous in many respects to block 704. At block 806, the remote access manager determines whether a key down state in the keyboard data received at block 804 is associated with a modifier key code. For example, a key down state according to the HID 1.11 format may be determined to be associated with a modifier key code if it is non-zero in the first byte, which is designated for modifier keys.

If the key down state is not associated with a modifier key code ("NO" at block 806), the remote access manager proceeds to block 808 and inserts a key up state after the key down state. For example, block 808 may be performed by the modified keyboard data generator 508, 608. If the key down state is associated with a modifier key code ("YES" at block 806), the remote access manager bypasses block 808 and proceeds to block 810.

At block 810, the remote access manager may forward the modified keyboard data to a host system via keyboard emulation. After block 810, the method 800 ends at block 812. In some implementations, blocks 806, 808 may be performed by the modifier key handler 610 to allow modifier keys to be held down.

Figure 9:
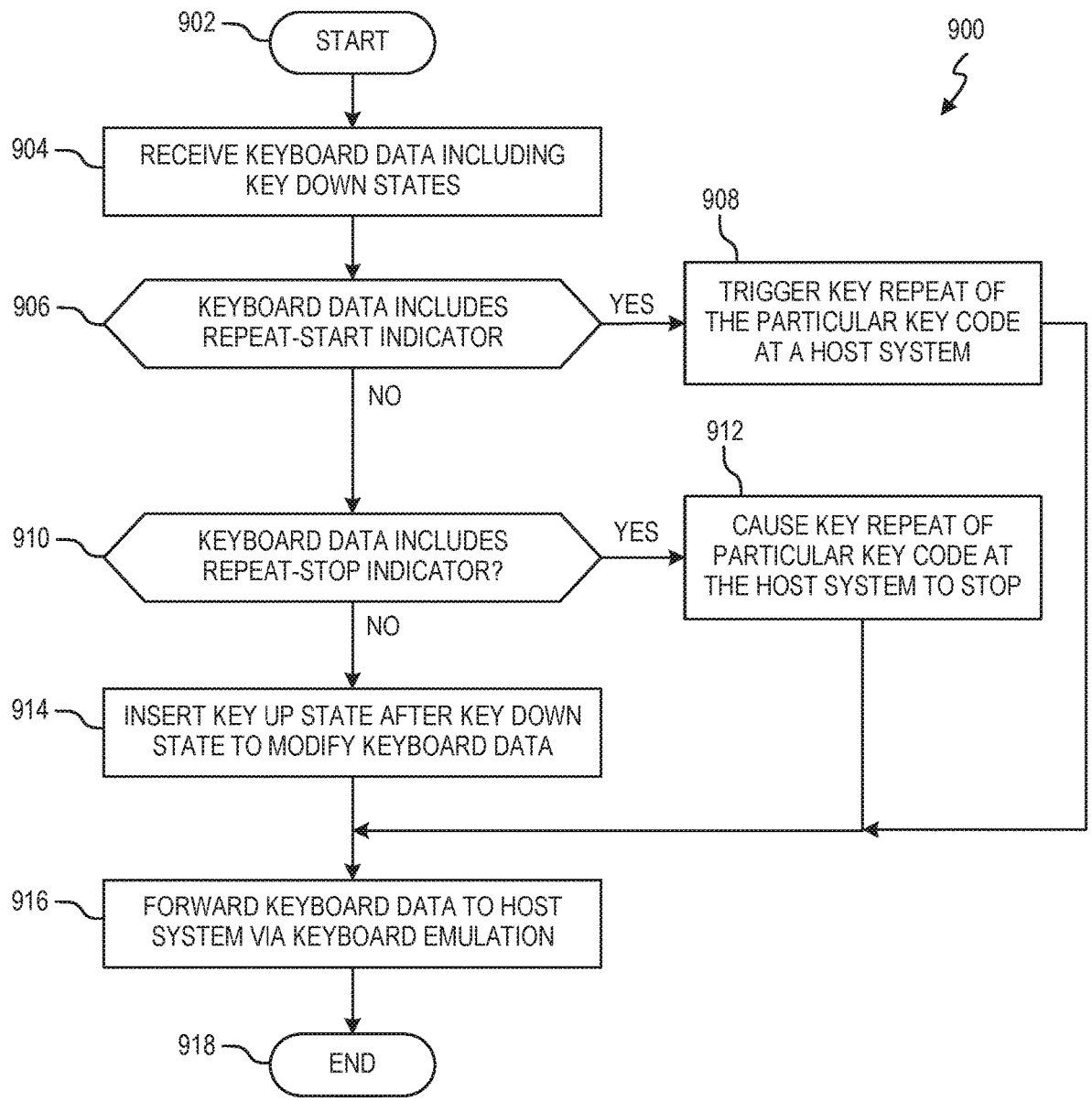
FIG. 9 is a flowchart of an example method that detects repeat-start and repeat-stop indicators, according to another implementation.

FIG. 9 is a flowchart of an example method 900 that detects repeat-start and repeat-stop indicators, according to an implementation. As with methods 700 and 800, method 900 may be implemented in the form of executable instructions stored on a machine readable medium and executed by a processing resource and/or in the form of electronic circuitry. Method 900 may be performed, for example, by the remote access manager 114, 504, or 604. In some implementations of the present disclosure, one or more blocks of method 900 may be executed substantially concurrently or in a different order than shown in FIG. 9. Some of the blocks of method 900 may, at times, be ongoing and/or may repeat. In some implementations of the present disclosure, method 900 may include more or fewer blocks than are shown in FIG. 9.

The method 900 may begin at block 902 and continue to block 904, where the remote access manager receives keyboard data that includes key down states from a client device. Block 904 may be analogous in many respects to block 704.

At block 906, the remote access manager detects in keyboard data received at block 904 a repeat-start indicator signifying intentional key repetition of a particular key code. In some implementations, the repeat-start indicator may be consecutive key down states for the particular key code.

In response to detection of a repeat-start indicator ("YES" at block 906), the remote access manager proceeds to block 908 and triggers a key repeat of the particular key code at a host system. For example, the remote access manager may prepare to send (in modified keyboard data, at block 916 below) a key down state to the host system without a subsequent key up state. After block 908, the remote access manager proceeds to block 916.

Returning to block 906, if the received keyboard data does not include a repeat-start indicator ("NO" at block 906), the remote access manager determines at block 910 whether the keyboard data includes a repeat-stop indicator. In response to detecting a repeat-stop indicator for the particular key code ("YES" at block 910), the remote access manager proceeds to block 912 and causes a key repeat of the particular key code at the host system to stop (e.g., by sending a key up state to the host system in modified keyboard data, at block 916 below). In some implementations, blocks 906, 908, 910, 912 may be performed by the key repetition handler 612. After block 912, the remote access manager proceeds to block 916.

Returning to block 910, if the keyboard data does not include a repeat-stop indicator ("NO" at block 910), the remote access manager proceeds to block 914 and inserts a key up state after a key down state to modify the received keyboard data. For example, block 914 may be performed by the modified keyboard data generator 508, 608.

At block 916, the remote access manager may forward the modified keyboard data to a host system via keyboard emulation. After block 916, the method 900 ends at block 918.

In view of the foregoing description, it can be appreciated that a client device may transmit keyboard data to a remote access manager, and the remote access manager may relay modified keyboard data (with inserted key up states) to a host system with minimal or no incidences of unintended key repetition that may otherwise result from network latency. Moreover, a remote access manager according to the foregoing example implementations works in environments including legacy BIOS (basic input/output system) and UEFI (unified extensible firmware interface), is independent of keyboard language settings, requires minimal or no user configuration, and does not consume much processing or memory resources. Additionally, the example implementations are compatible with modifier keys as well as intentional key repetition.

In the foregoing description, numerous details are set forth to provide an understanding of the subject matter disclosed herein. However, implementation may be practiced without some or all of these details. Other implementations may include modifications and variations from the details discussed above. It is intended that the following claims cover such modifications and variations.

The invention claimed is:

1. An apparatus of a host comprising:
   a communication interface; and
   a hardware-based remote access manager coupled to the communication interface, the remote access manager including:
   a keyboard data receiver that receives keyboard data arriving at the communication interface from a client device via a communication channel, wherein the client device receives sequential key input reports that include key down states followed by respective key up states from a keyboard external to the client device, and a console application executing on the client device formats the sequential keyboard input reports to generate the keyboard data and transmits the keyboard data to the communication interface via the communication channel, and
   a modified keyboard data generator that inserts a key up state after each key down state that is not associated with modifier key codes in the received keyboard data to generate modified keyboard data,
   wherein the client device and the host are separate computing systems,
   the remote access manager is included in a baseboard management controller of the host, and
   the baseboard management controller operates independently of the host and includes a capability to cooperate with the console application to manage the host, including when the host has failed, is powered off, or is not running.

2. The apparatus of claim 1, wherein the remote access manager is to forward the modified keyboard data to a host system of the host.

3. The apparatus of claim 2, wherein a duration in the modified keyboard data between the key down state and the key up state inserted after the key down state is less than a key repeat delay of the host system.

4. The apparatus of claim 1, wherein the remote access manager includes a modifier key handler that:
detects if a key down state in the received keyboard data is associated with a modifier key code, and excepts the key down state associated with the modifier key code from insertion of a subsequent key up state by the modifier keyboard data generator.

5. The apparatus of claim 1, wherein the remote access manager includes a key repetition handler that:
detects, in the received keyboard data, a repeat-start indicator inserted by the console application for a particular key code during formatting of the sequential keyboard input reports to generate the keyboard data, and
in response to the detected repeat-start indicator, triggers a key repeat of the particular key code at a host system of the host.

6. The apparatus of claim 5, wherein the key repetition handler is to:
detect, in the received keyboard data, a repeat-stop indicator inserted by the console application occurring after the repeat-start indicator, and
in response to the repeat-stop indicator, cause the key repeat of the particular key code at the host system to stop.

7. The apparatus of claim 1, wherein the received keyboard data includes repeated key down states for a same key code, and the modified keyboard data generator is to insert a key up state after each of the repeated key down states for the same key code.

8. The apparatus of claim 1, wherein the received keyboard data are out-of-band communications by which the client device remotely manages the host or a host system of the host, and the communication channel includes an out-of-band communication path by which the client device communicates the keyboard data to the remote access manager.

9. The apparatus of claim 1, wherein to generate the keyboard data, the console application formats the sequential keyboard input reports by retaining key down states in an order received from the keyboard and discarding key up states except key up states associated with modifier key codes.

10. A method comprising:
receiving, by a baseboard management controller of a host, keyboard data from a client device via an out-of-band communication channel, wherein the client device receives sequential key input reports that include key down states followed by respective key up states from a keyboard external to the client device, and a console application executing on the client device formats the sequential keyboard input reports to generate the keyboard data and transmits the keyboard data via the communication channel to a communication interface coupled to the baseboard management controller; and
inserting, by the baseboard management controller, a key up state after each key down state in the received keyboard data that is not associated with a modifier key code to generate modified keyboard data,
wherein the baseboard management controller operates independently of the host,
the client device and the host are separate computing systems, and
the baseboard management controller includes a capability to cooperate with the console application to manage the host, including when the host has failed, is powered off, or is not running.

11. The method of claim 10, comprising forwarding, by the baseboard management controller, the modified keyboard data to a host system of the host via keyboard emulation.

12. The method of claim 10, comprising detecting in the received keyboard data, by the baseboard management controller, a repeat-start indicator inserted by the console application during formatting of the sequential keyboard input reports to generate the keyboard data, the repeat-start indicator signifying intentional key repetition of a particular key code.

13. The method of claim 12, wherein the repeat-start indicator includes consecutive key down states for the particular key code.

14. The method of claim 12, comprising:
triggering, by the baseboard management controller, a key repeat of the particular key code at a host system of the host in response to detection of the repeat-start indicator; and
causing, by the baseboard management controller, the key repeat of the particular key code at the host system to stop in response to detecting in the received keyboard data a repeat-stop indicator inserted by the console application for the particular key code.

15. The method of claim 10, wherein to generate the keyboard data, the console application formats the sequential keyboard input reports by retaining key down states in an order received from the keyboard and discarding key up states except key up states associated with modifier key codes.

16. A non-transitory machine readable medium storing instructions executable by a processing resource of a baseboard management controller of a host, the non-transitory machine readable medium comprising:
instructions to receive keyboard data transmitted by a console application of a client device via a communication channel, wherein the client device receives sequential key input reports that include key down states followed by respective key up states from a keyboard external to the client device, and a console application executing on the client device generates the keyboard data by formatting the sequential keyboard input reports;
instructions to insert a key up state after each key down state that is not associated with modifier key codes in the received keyboard data to generate modified keyboard data; and
instructions to forward the modified keyboard data to the host,
wherein the client device and the host are separate computing systems,
the baseboard management controller operates independently of the host, and
the baseboard management controller includes a capability to cooperate with the console application to manage the host, including when the host has failed, is powered off, or is not running.

17. The non-transitory machine readable medium of claim 16, wherein the communication channel includes an out-of-band communication path between the client device and the baseboard management controller, and the received keyboard data are communications by the client device to remotely manage the host via the baseboard management controller.

18. The non-transitory machine readable medium of claim 16, wherein to generate the keyboard data, the console application formats the sequential keyboard input reports by retaining key down states in an order received from the keyboard and discarding key up states except key up states associated with modifier key codes.

19. The non-transitory machine readable medium of claim 18, further comprising:

instructions to detect if a key down state in the received keyboard data is associated a modifier key code; and instructions to bypass the instructions to insert the key up state for the key down state that is associated with the modifier key code.

20. The non-transitory machine readable medium of claim 16, further comprising:

instructions to detect, in the received keyboard data, a repeat-start indicator inserted by the console application for a particular key code during formatting of the sequential keyboard input reports to generate the keyboard data;

instructions to respond to the detected repeat-start indicator by triggering a key repeat of the particular key code at a host system of the host;

instructions to detect, in the received keyboard data, a repeat-stop indicator inserted by the console application occurring after the repeat-start indicator; and instructions to respond to the detected repeat-stop indicator by causing the key repeat of the particular key code at the host system to stop.

* * * * *